United States Patent [19]

Pinckaers

[11] 4,256,978

[45] Mar. 17, 1981

[54] ALTERNATING POLARITY POWER SUPPLY CONTROL APPARATUS

[75] Inventor: B. Hubert Pinckaers, Edina, Minn.

[73] Assignee: Honeywell Inc., Minneapolis, Minn.

[21] Appl. No.: 973,216

[22] Filed: Dec. 26, 1978

[51] Int. Cl.$^3$ .................. H03K 17/60; H01L 29/72
[52] U.S. Cl. ................................. 307/584; 307/279; 307/304
[58] Field of Search ............. 307/251, 279, 304, 268; 323/4; 357/22, 27

[56] References Cited

U.S. PATENT DOCUMENTS

| | | | |
|---|---|---|---|
| 3,112,410 | 11/1963 | Schmid | 307/254 |
| 3,131,312 | 4/1964 | Putzrath | 307/251 |
| 3,348,062 | 10/1967 | Carlson et al. | 307/251 |
| 4,148,046 | 4/1979 | Hendrickson et al. | 357/22 |
| 4,148,047 | 4/1979 | Hendrikson | 357/23 |
| 4,152,714 | 5/1979 | Hendrickson et al. | 357/22 |

*Primary Examiner*—Stanley D. Miller, Jr.
*Assistant Examiner*—B. P. Davis
*Attorney, Agent, or Firm*—Theodore F. Neils

[57] ABSTRACT

An electronic switching circuit is provided for controlling transfer of electrical power from an alternating polarity electrical power supply to a load means through use of a field-effect transistor device as the primary power controlling element.

19 Claims, 5 Drawing Figures

ALTERNATING POLARITY POWER SUPPLY CONTROL APPARATUS

Reference is hereby made to copending applications by T. E. Hendrickson entitled "Alternating Polarity Power Supply Control Apparatus" having Ser. No. 973,215, and by T. E. Hendrickson and T. C. Spindler entitled "Alternating Polarity Power Supply Control Apparatus" having Ser. No. 973,463, which were both filed on even date with the present application and which are all assigned to the same assignee as the present application. Reference is also made to earlier filed, but copending applications, all assigned to the same assignee, by T. E. Hendrickson entitled "Semiconductor Apparatus" having Ser. No. 869,981, by T. E. Hendrickson, et al., entitled "Semiconductor Apparatus" having Ser. No. 869,980, and by T. E. Hendrickson, et al., entitled "Semiconductor Apparatus," having Ser. No. 869,977.

BACKGROUND OF THE INVENTION

The present invention is related to circuits in which a field-effect transistor device controls power transfer from an alternating polarity electrical power supply to a load means, particularly when such field-effect transistor devices are capable of being integrated in monolithic integrated circuits.

Various solid state devices have been used in circuits as the primary means for controlling power transfer from an alternating polarity electrical power supply to whatever kind of load means is of interest for use in the circuit. For instance, planar bipolar power transistors have been used but these are devices which are not bidirectional by nature and which exhibit an inherent, more or less irreducible, minimum power dissipation characteristic even when fully switched on. And to be switched fully on, bipolar power transistors require a substantial amount of base current, i.e., control current, especially for higher collector, or load, currents. Furthermore, they are also subject by nature to thermal runaway.

Perhaps more commonly used for controlling alternating polarity power supplies are thyristors of various kinds such as silicon controlled rectifiers and triacs. Such thyristors are switching devices primarily used in alternating polarity power supply control circuits because of their capability for handling relatively large power dissipations when switched fully on and for withstanding substantial reverse voltages when switched fully off. An advantage of these devices over bipolar power transistors is that they require little electrical power at device control gates whether operating in the off condition or in the on condition.

However, such thyristors also have several disadvantages such as being a latching switch, that is, operating only fully on or fully off. Further, the thyristor device can be switched off by sufficiently reducing the current therethrough, and can be switched on by sharp voltage transients thereacross—both results being obtained without any action taking place at the control terminal of the thyristor device. Hence, the control terminal of the thyristor has relatively little continuous control capability. This same control terminal, in many situations, cannot be electrically isolated simply and inexpensively from the load circuit, and may require large triggering currents to switch on the thyristor device. Finally, a thyristor device cannot be easily provided in a monolithic integrated circuit with other circuit components because of its structure and power dissipation.

Hence, better primary power controlling devices are desired for use in controlling power transfer from alternating polarity electrical power supplies in alternating polarity operated circuits. Particularly useful would be a device which could be easily provided in a monolithic integrated circuit along with other circuit components, at least some of which would also be used in controlling power transfer from the alternating polarity power supply used. This would require that such a device not have too large a resistance if switched fully on, despite substantial current loads, but which would have a structure easily fabricated in such an integrated circuit. Further, the device should have a bidirectional current conduction capability for circuits in which current rectification is not desired.

Field-effect transistor devices can have many of the characteristics just described, including having a very symmetrical bidirectional current conducting capability when on. This is certainly so for metal-oxide-semiconductor field-effect transistor (MOSFET) devices which have the advantage of having the gates therein being very well isolated from the channel regions of the device. This isolation aids in providing a circuit to operate the field-effect transistor device when both the circuit and these devices are formed in a monolithic integrated circuit chip, a difficult arrangement when the integrated circuit is to operate with an alternating polarity power supply. Such circuits must permit the operation of other circuit component devices in the monolithic integrated circuit while also controlling power transfers from the alternating polarity power supply through operating the primary power transfer control field-effect device.

Electronic component device theory shows that field-effect transistors are controlled by controlling the voltage appearing between the gate thereof and that one of the connections to the channel regions therein which is effectively serving as the transistor source. Difficulties arise in those circuits using a field-effect transistor to control power transfers from an alternating polarity power supply because the two connections to the channel region of such a transistor serve alternately as the source rather than one of them serving continually as the source.

SUMMARY OF THE INVENTION

The circuit of the invention provides a field-effect device having unidirectional current conducting means electrically connected from either side of the field-effect device channel to the gate region of that device. This circuit is for use in controlling power transfers between an alternating polarity power supply and a load, both of which, in operation, would be connected between either side of the device channel. Selectively introducing a voltage potential between the unidirectional current conducting means devices and the gate region permits selecting the occurrence of power transfers from the alternating polarity power supply to the load.

DESCRIPTION OF THE PREFERRED EMBODIMENTS

Figure 1:
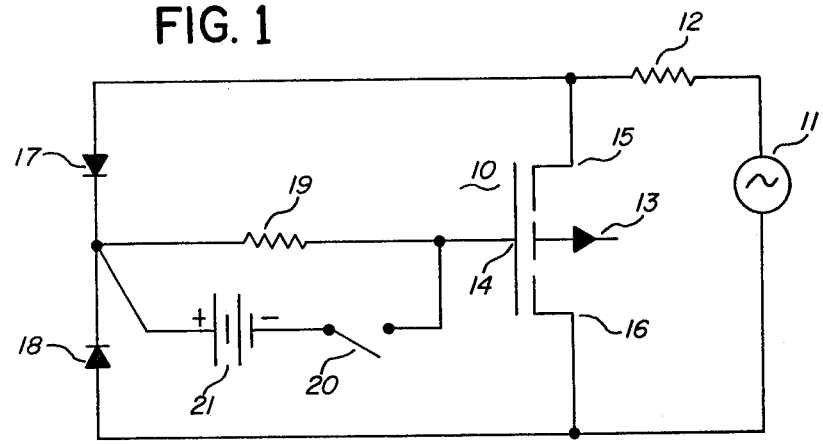
FIG. 1 shows a first embodiment of the circuit of the invention.

Turning now to FIG. 1, a first circuit embodying the present invention is shown. The primary power controlling device is a field-effect transistor device, 10, which controls the flow of power from an alternating polarity voltage power supply device, 11, to a load means, 12. Load means 12 is shown as a resistive load to avoid having the following discussion expand to encompass magnitude and phase angle relationships between the voltages and currents occurring in the circuit of FIG. 1. However, load means 12 in practice could also have reactive load portions provided therewith.

Field-effect transistor device 10 is shown as an enhancement mode, p-channel field-effect transistor. However, device 10 represents any field-effect device which effectively behaves as such an enhancement mode, p-channel field-effect transistor as opposed to the typical signal device structure often associated with the symbol for device 10 in FIG. 1. In this regard, the applications referenced above entitled "Semiconductor Apparatus" teach various devices which could be used for device 10 in FIG. 1. This is particularly so where some or all of the circuit in FIG. 1 (other than the power supplies) is to be formed in a monolithic integrated circuit, including forming device 10 therein.

Field-effect transistor 10 is shown having an open-circuit substrate electrode, 13, and a gate electrode 14. Also shown in transistor 10 are two electrodes which are connected to pass through transistor 10 whatever major currents are to flow therethrough. These are electrodes 15 and 16 which provide ohmic contact to the electrical path regions encompassing the channel region of transistor 10. Depending on the alternating polarity of supply 11, electrode 15 will alternately serve as a source and as a drain in the circuit of FIG. 1, and electrode 16 will be simultaneously serving in just the opposite role during circuit operation.

Diodes, 17 and 18, are connected as unidirectional current conducting means from electrodes 15 and 16, respectively, of transistor 10 through a resistor, 19, to gate electrode 14. Each of diodes 17 and 18 has a small but finite reverse current leakage therethrough before any reverse bias voltage thereon reaches breakdown values. In the situation of FIG. 1, the cathodes of diode 17 and 18 are connected both together and to resistor 19. The anode of the diode 17 is connected to electrode 15 and to one side of load means 12 while the anode of diode 18 is connected to electrode 16 and one side of supply 11. The value of resistor 19 is not critical and a typical choice would be 1.0 megohm.

Finally, a constant polarity voltage supply, 21, is shown connected in series with a switch, 20. This series arrangement is placed in parallel across resistor 19 with the positive terminal of supply 21 connected to the cathodes of diode 17 and 18.

To understand the circuit of FIG. 1 in operation, first consider the situation in which switch 20 is open and in which the load side of supply 11 presents a positive cycle of the supply voltage output relative to the other side of supply 11. In this situation, the circuit will prevent any significant power from being delivered to load means 12 from supply 11 by virtue of transistor 10 being switched off. Again considering the above stated supply 11 voltage situation, electrode 15 serves as the source while electrode 16 is the drain in accord with p-channel field-effect transistor device theory. This means, for transistor 10 to be switched on, that gate electrode 14 must be at a voltage more negative than the voltage on electrode 15, more negative by an amount at least exceeding the threshold voltage of transistor 10. Because there usually is a desire to dissipate very little power in control transistor 10, the voltage on gate 14 must be more negative than that on electrode 15 by an amount considerably more than the threshold voltage of transistor 10. This is the condition that must be met if transistor 10 is to be switched on sufficiently to have a very low channel resistance and so exhibit low power dissipation. If the voltage on gate 14 does not meet the condition of being more negative than the transistor 10 theshold voltage, transistor 10 will be off.

In the supply voltage situation described above, with switch 20 open, transistor 10 is maintained off because gate 14 is only a diode voltage drop more negative in voltage than electrode 15 which is following the positive voltage on supply 11. A gate current for charging gate capacitances of transistor 10, and for supplying gate leakage currents, will flow through diode 17 and resistor 19, the gate leakage current being very small because of the very high gate impedance of transistor 10. Also, diode 17 and gate capacitances will supply the above-mentioned leakage current of diode 18 which is reverse biased and otherwise plays no role in the circuit operation in this positive cycle of supply voltage 11. The resulting voltage drop across diode 17 is less than the threshold voltage of transistor 10 so that transistor 10 is off.

When the polarity of the load side of supply 11 changes so that a negative voltage appears on electrode 15 with respect to electrode 16, device theory for transistor 10 indicates electrode 16 of transistor 10 becomes the source electrode while electrode 15 of transistor 10 becomes the drain electrode. Then to turn on transistor 10, the gate electrode 14 must be more negative than electrode 16 by at least the threshold voltage of transistor 10. But with switch 20 open, the voltage on gate 14 is no more than one voltage drop more negative than that on electrode 16 due to the voltage clamping of diode 18 (and it may be more positive because of previously charged gate capacitances if these are not sufficiently discharged by the leakage of diodes 17 and 18). Diode 17 is reversed biased and, beyond its reverse current leakage, has no effect on circuit operation in these conditions. Hence, transistor 10 continues to be maintained off. The result, with switch 20 open, is that at no time during a period, or cycle, of voltage supply 11 does transistor 10 turn on.

If the supply output voltage polarity alternation frequency is sufficient and if the reverse leakages of diodes 17 and 18 are sufficiently small, the gate capacitances may have an average charge after the initial power supply cycle sufficient to keep both diodes 17 and 18 reversed biased except at times when the supply voltage is sufficiently near the peaks thereof. In these circumstances, there will always be a positive voltage on gate 14 of transistor 10 also acting to hold this transistor off. Such parasitic capacitance effects will for the most part be ignored in the following on the assumption that the supply 11 output voltage polarity alternation frequency is sufficiently low to permit these parasitic capacitances to sufficiently discharge so as not to alter the current operation described.

Now, in contrast, consider the situation with switch 20 closed. When supply 11 is in the voltage cycle portion in which the load side of the supply is positive, i.e., when a positive voltage is placed on electrode 15 with respect to electrode 16, then gate 14 is more negative than electrode 15 by both the diode drop due to diode 17 and the voltage provided by supply 21. Thus, if the voltage of supply 21, placed between the acting source and the gate of transistor 10, is sufficiently in excess of the transistor 10 threshold voltage, transistor 10 will be strongly turned on in the circuit of FIG. 1 when switch 20 is closed. This result permits power to be delivered from supply 11 to load means 12 through transistor 10. Diode 18, being reversed biased in these circumstances, does not affect circuit operation.

Of course, sufficient positive voltage on gate 14 due to gate capacitances not having been sufficiently discharged may result in the voltage on gate 14 remaining positive with respect to electrode 15 despite switch 20 being closed. Then transistor 10 would remain off even though switch 20 had been closed. As stated above, such parasitic capacitance effects will not be further considered because of sufficiently slow polarity alternation in the output voltage of supply 11.

When the voltage cycle of supply 11 changes to a point in time that the load side of the supply is negative, such that electrode 15 becomes negative with respect to electrode 16, device theory again indicates that electrode 16 becomes the acting source with electrode 15 the acting drain. In these circumstances, transistor 10 will again be turned on through the voltage drops across both diode 18 and resistor 19, this due to switch 20 being closed permitting supply 21 to be across resistor 19. The result is that power will be transferred from supply 11 to load 12. Diode 17 will again be backed biased and not a factor in the operation of the circuit in this part of the cycle. Hence, switch means 20 can be selectively operated to select those times in the operation of the circuit of FIG. 1 when power is supplied from source 11 to load means 12.

Figure 2:
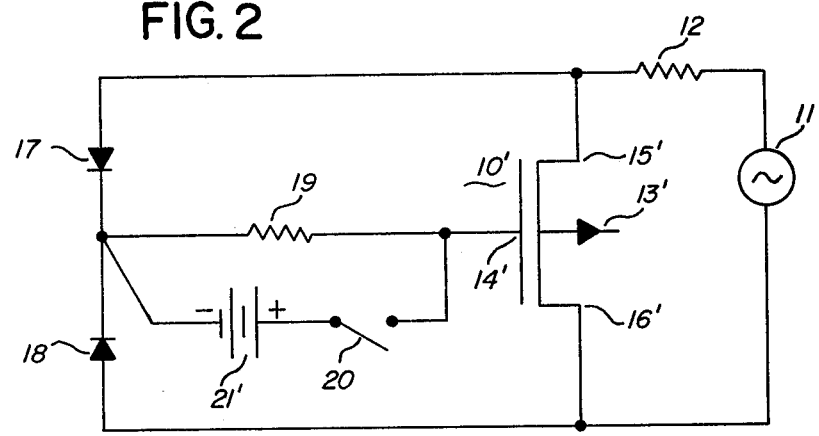
FIG. 2 shows a second embodiment of the circuit of the invention.

FIG. 2 shows the circuit of FIG. 1 with two changes. A new field-effect transistor device, 10', is substituted for the enhancement mode, p-channel field-effect transistor 10 of FIG. 1. Also, another power supply means, 21', has been substituted in FIG. 2 for supply means 21 of FIG. 1 but with supply means 21' having a reversed polarity. Device 10' is, or behaves effectively as, a depletion mode, p-channel, metal-oxide-semiconductor field-effect transistor. Operation of the circuit in FIG. 2 is essentially like that in FIG. 1 except that transistor 10' is now turned on when switch means 20 is open because of operation of transistor 10' in the depletion mode.

In the depletion mode, a transistor is turned on when the gate is at some negative voltage, at zero voltage or at a positive voltage less than some threshold voltage with respect to the source voltage. Only when the gate voltage is more positive than the source voltage by at least the threshold voltage is the transistor turned off. Hence, when switch means 20 closes, gate 14' will be held positive by supply 21' with respect to whichever of electrodes 15' and 16' happens to be acting as the source by virtue of that electrode being positive with respect to the other depending on where supply 11 is in its output voltage cycle. This relative positiveness of electrode 14' will lead to turning off transistor 10' if the magnitude of voltage supply 21' is sufficiently large.

Devices such as junction field-effect devices (JFET) and metal-semiconductor field-effect devices (MESFET) are also basically depletion mode devices. Thus, devices of these kinds, with properly chosen conductivity type channels, will operate in MOSFET depletion mode circuits such as that of FIG. 2.

Figure 3:
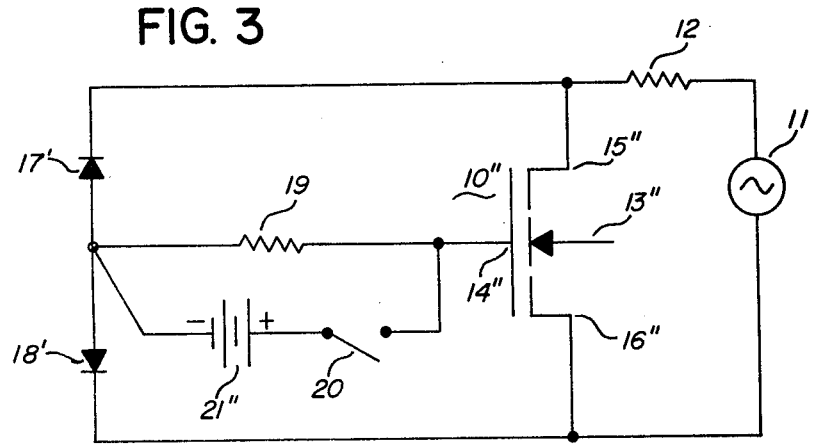
FIG. 3 shows a third embodiment of the circuit of the invention.
Figure 4:
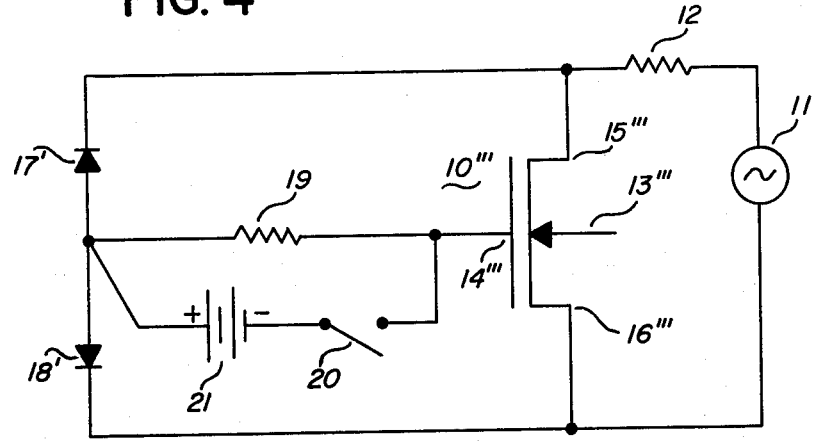
FIG. 4 shows a fourth embodiment of the circuit of the invention.

FIGS. 3 and 4 show circuits which are analogous to the previous two circuits, respectively, but which use n-channel, metal-oxide-semiconductor transistor devices. FIG. 3 shows an, or what behaves effectively as, an enhancement mode, n-channel metal-oxide-semiconductor transistor 10''. The diode terminals have been shown connected in the reverse manner in FIGS. 3 and 4 from the manner they were shown to be connected in FIGS. 1 and 2. Hence, in FIGS. 3 and 4, these diodes are designated 17' and 18'.

This reversal of diode connections is needed because of the use of an n-channel transistor for power control in FIGS. 3 and 4 rather than the p-channel transistor used in FIGS. 1 and 2. When electrode 15'' of FIG. 3 is positive with respect to electrode 16'' (because the load side of supply 11 is in the positive part of the supply output voltage cycle with respect to the other side of supply 11) device theory indicates that electrode 16'' is the acting source with electrode 15'' acting as the drain. To turn on transistor 10'', gate region 14'' must be made positive with respect to electrode 16'' by an amount equal to or in excess of the transistor threshold voltage. Any lesser voltage difference, such as that voltage drop occurring across diode 18' when switch 20 is open, leaves transistor 10'' turned off.

Turning transistor 10'' on to thereby supply power from supply 11 to load means 12, in the foregoing circumstances, is accomplished by closing switch 20 so that supply 21' is then across resistor 19 and this serves to bias gate 14'' positive with respect to electrode 16'' through diode 18'. Diode 17' does not affect the circuit performance in these circumstances.

When the voltage on the load side of supply 11 goes negative in the appropriate portions of the output voltage cycle of supply 11 with switch 20 closed, then gate 14' is biased positively through diode 17' with respect to electrode 15''. Here electrode 15'' acts as the source and transistor 10'' turns on delivering power to load means 12 from supply 11. In this situation electrode 18' is not a factor in circuit operation.

Again, leaving switch 20 open in this supply 11 voltage situation means that the voltage on gate 14'' differs from that on electrode 15'' by only the drop across diode 17' and so gate 14'' is not sufficiently positive with respect to electrode 15'' to turn on transistor 10''. Substrate 13'' is left unconnected as were the substrates in the p-channel circuits of FIGS. 1 and 2.

FIG. 4 shows a depletion mode, n-channel, metal-oxide-semiconductor field-effect transistor 10''', or its effective equivalent, being used in substitution for transistor 10'' of FIG. 3. In FIG. 4, supply 21 is poled in such a way as to provide a negative voltage on electrode 14''' to switch transistor 10''' off when switch 20 is closed. Opening switch 20 leads to turning transistor 10''' on because of its depletion mode operation as gate 14''' then is held within a diode drop of the negative side of supply 11 as it goes through its output voltage cycle. Substrate electrode 13''' is again unconnected.

The preceding circuit operation descriptions for the circuits of FIGS. 1 through 4 assume a sufficiently low frequency of polarity alternation in the output voltage of alternating polarity voltage power supply 11. Otherwise parasitic capacitive, diode and resistive effects associated with the power control transistor in these circuits may lead to different operation results. One possible manner to raise the allowed frequency of polarity alternation in the output voltage of supply 11 would be to effectively increase the leakage of the diodes in these circuits by shunting them with resistors.

Figure 5:
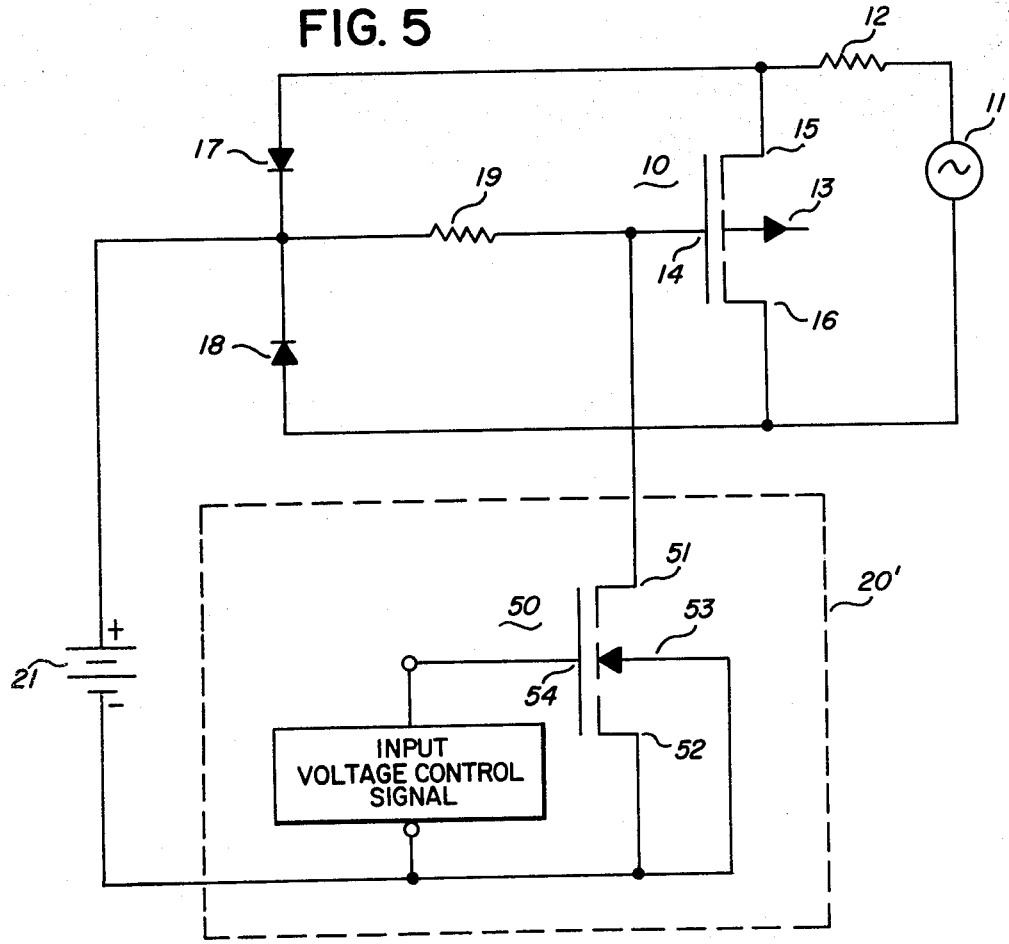
FIG. 5 shows a fifth embodiment of the circuit of the invention.

The input control switching means 20 in each of the preceding circuits has been shown to be a mechanically operated switch, primarily for ease of exposition and understanding. However, in most applications of this circuit, an electronic switching means for switch 20 is more likely to be used. FIG. 5 shows one possible kind of such an electronic switching means when provided in the circuit of FIG. 1. The designations from FIG. 1 have been maintained in FIG. 5 for similar components as appropriate.

Operation of the circuit shown in FIG. 5 is just like that of FIG. 1 except that switching means 20', replacing switch 20 of FIG. 1, now comprises an n-channel, enhancement mode, metal-oxide-semiconductor field-effect transistor, 50, having a drain electrode, 51, and a source electrode 52, and a substrate electrode, 53. An input control signal voltage source, 55, is connected between gate region 54 and terminal 52 of transistor 50. A p-channel, enhancement mode MOSFET with an open-circuit substrate could also be used in place of transistor 50. However, with such a p-channel MOSFET, control source 55 would be connected between the counterparts of gate 54 and terminal 51.

When, in the circuit of FIG. 5, a voltage signal sufficiently larger than the threshold voltage of transistor 50 is provided by signal source 55, transistor 50 will be turned on causing a bias voltage, due to supply 21, to appear across resistor 19 with the relatively negative voltage value end of resistor 19 being connected to gate 14 of transistor 10. This will be sufficient to turn on transistor 10 for the purpose of transferring power from supply 11 to load means 12 in accord with the explanation of operation given in connection with FIG. 1.

Where the circuits in FIGS. 1 through 5 are to be partially or fully integrated in monolithic integrated circuits, the circuit components shown in FIGS. 1 through 5 will be provided in appropriate manner. That is, for instance, the diodes may be provided by having a metal-oxide-semiconductor transistor operated with its drain tied to its gate while the resistors may also be formed by an active circuit component or by an electrically isolated semiconductor material portion serving as a passive resistor.

The embodiments of the invention in which an exclusive property or right is claimed are defined as follows:

1. An electronic switching circuit for controlling transfer of electrical power from an alternating polarity electrical power supply means to a load means, said switching circuit comprising:

a first transfer control field-effect device provided in and on a substrate, said first transfer control field-effect device comprising:
  a first channel region located at least in part in a first selected region of said substrate;
  first and second terminating regions, separated by said first channel region, into which and out of which primary currents through said first field-effect device can, at least in part, pass upon electrical energization of said first and second terminating regions, said first terminating region being electrically connected to a first terminal means adapted for electrical connection to a first circuit portion arrangement which includes both said alternating polarity electrical power supply means and said load means, and said second terminating region being electrically connected to a second terminal means adapted for electrical connection to said first circuit portion arrangement; and
  a gate region capable of affecting, upon electrical energization thereof, any current flow occurring through said first channel region as a result of electrical energization of said first and second terminating regions;

a bias control means having an electrical connection between a first location therein and a second location therein, and further, said bias control means being capable of selectively providing a bias voltage between said first and second locations therein upon electrical energization of said bias control means, said bias control means first location being electrically connected to said gate region;

a first unidirectional current conducting means having first and second terminating regions between which an asymmetrical current conducting capability is exhibited, said first unidirectional current conducting means first terminating region being electrically connected to one of said first and second terminal means, and said first unidirectional current conducting means second terminating region being electrically connected to said bias control means second location; and a second unidirectional current conducting means having first and second terminating regions between which an asymmetrical current conducting capability is exhibited, said second unidirectional current conducting means first terminating region being electrically connected to that one of said first and second terminal means opposite that to which said first unidirectional current conducting means first terminating region is connected as aforesaid, and said second unidirectional current conducting means second terminating region being electrically connected to said bias control means second location, whereby electrical power can be selectively transferred from said alternating polarity electrical power supply means to said load means in correspondence with said selective providing of said bias voltage between said bias control means first and second locations.

2. The apparatus of claim 1 wherein said circuit further comprises:
said first transfer control field-effect device being effectively an enhancement mode, n-channel, metal-oxide-semiconductor field-effect transistor (MOSFET), with said first field-effect device first and second terminating regions being source and drain regions therein, and with said gate region being separated from said first selected region of said substrate by an insulating layer;
said first unidirectional current conducting means being a first diode having an anode and a cathode, with said first diode cathode serving as said first unidirectional current conducting means first terminating region, and with said first diode anode serving as said first unidirectional current conducting means second terminating region; and
said second unidirectional current conducting means being a second diode having an anode and a cathode, with said second diode cathode serving as said second unidirectional current conducting means first terminating region, and with said second diode anode serving as said second unidirectional current conducting means second terminating region.

3. The apparatus of claim 1 wherein said circuit further comprises:

said first transfer control field-effect device being effectively a depletion mode, n-channel, metal-oxide-semiconductor field-effect transistor (MOSFET), with said first field-effect device first and second terminating regions being source and drain regions therein, and with said gate region being separated from said first selected region of said substrate by an insulating layer;

said first unidirectional current conducting means being a first diode having an anode and a cathode, with said first diode cathode serving as said first unidirectional current conducting means first terminating region, and with said first diode anode serving as said first unidirectional current conducting means second terminating region; and said second unidirectional current conducting means being a second diode having an anode and a cathode, with said second diode cathode serving as said second unidirectional current conducting means first terminating region, and with said second diode anode serving as said second unidirectional current conducting means second terminating region.

4. The apparatus of claim 1 wherein said circuit further comprises:

said first transfer control field-effect device being effectively an enhancement mode, p-channel, metal-oxide-semiconductor field-effect transistor (MOSFET), with said first field-effect device first and second terminating regions being source and drain regions therein, and with said gate region being separated from said first selected region of said substrate by an insulating layer;

said first unidirectional current conducting means being a first diode having an anode and a cathode, with said first diode anode serving as said first unidirectional current conducting means first terminating region, and with said first diode cathode serving as said first unidirectional current conducting means second terminating region; and said second unidirectional current conducting means being a second diode having an anode and a cathode, with said second diode anode serving as said second unidirectional current conducting means first terminating region, and with said second diode cathode serving as said second unidirectional current conducting means second terminating region.

5. The apparatus of claim 1 wherein said circuit further comprises:

said first transfer control field-effect device being effectively a depletion mode, p-channel, metal-oxide-semiconductor field-effect transistor (MOSFET), with said first field-effect device first and second terminating regions being source and drain regions therein, and with said gate region being separated from said first selected region of said substrate by an insulating layer;

said first unidirectional current conducting means being a first diode having an anode and a cathode, with said first diode anode serving as said first unidirectional current conducting means first terminating region, and with said first diode cathode serving as said first unidirectional current conducting means second terminating region; and said second unidirectional current conducting means being a second diode having an anode and a cathode, with said second diode anode serving as said second unidirectional current conducting means first terminating region, and with said second diode serving as said second unidirectional current conducting means second terminating region.

6. The apparatus of claim 1 wherein said circuit further comprises:

said first transfer control field-effect device selectively being a selected one of effective n-channel and p-channel junction field-effect transistors (JFET), with said first field-effect device first and second terminating regions being source and drain regions therein; and said first and second unidirectional current conducting means being first and second diodes, respectively, said first and second diodes each having an anode and a cathode serving as said terminating regions in said first and second unidirectional current conducting means.

7. The apparatus of claim 1 wherein said circuit further comprises:

said first transfer control field-effect device being effectively a metal-semiconductor field-effect transistor (MESFET), with said first field-effect device first and second terminating regions being source and drain regions therein; and said first and second unidirectional current conducting means being first and second diodes, respectively, said first and second diodes each having an anode and a cathode serving as said terminating regions in said first and second unidirectional current conducting means.

8. The apparatus of claim 2 wherein said bias control means has resistive means directly electrically connected between said bias control means first and second locations.

9. The apparatus of claim 3 wherein said bias control means has resistive means directly electrically connected between said bias control means first and second locations.

10. The apparatus of claim 4 wherein said bias control means has resistive means directly electrically connected between said bias control means first and second locations.

11. The apparatus of claim 5 wherein said bias control means has resistive means directly electrically connected between said bias control means first and second locations.

12. The apparatus of claim 8 wherein said bias control means further comprises a selected one of said bias control means first and second locations being electrically connected to a control input switching means.

13. The apparatus of claim 9 wherein said bias control means further comprises a selected one of said bias control means first and second locations being electrically connected to a control input switching means.

14. The apparatus of claim 10 wherein said bias control means further comprises a selected one of said bias control means first and second locations being electrically connected to a control input switching means.

15. The apparatus of claim 11 wherein said bias control means further comprises a selected one of said bias control means first and second locations being electrically connected to a control input switching means.

16. The apparatus of claim 8 wherein said bias control means further comprises said bias control means first location being electrically connected to a third terminal means and said bias control means second location being electrically connected to a fourth terminal means, said third and fourth terminal means being adapted for electrical connection to a second circuit portion arrangement which includes a control input switching means and a constant polarity electrical power supply means having a positive terminal thereon electrically connected on said bias control means first location side of said second circuit arrangement.

17. The apparatus of claim 9 wherein said bias control means further comprises said bias control means first location being electrically connected to a third terminal means and said bias control means second location being electrically connected to a fourth terminal means, said third and fourth terminal means being adapted for electrical connection to a second circuit portion arrangement which includes a control input switching means and a constant polarity electrical power supply means having a positive terminal thereon electrically connected on said bias control means second location side of said second circuit arrangement.

18. The apparatus of claim 10 wherein said bias control means further comprises said bias control means first location being electrically connected to a third terminal means and said bias control means second location being electrically connected to a fourth terminal means, said third and fourth terminal means being adapted for electrical connection to a second circuit portion arrangement which includes a control input switching means and a constant polarity electrical power supply means having a positive terminal thereon electrically connected on said bias control means second location side of said second circuit arrangement.

19. The apparatus of claim 11 wherein said bias control means further comprises said bias control means first location being electrically connected to a third terminal means and said bias control means second location being electrically connected to a fourth terminal means, said third and fourth terminal means being adapted for electrical connection to a second circuit portion arrangement which includes a control input switching means and a constant polarity electrical power supply means having a positive terminal thereon electrically connected on said bias control means first location side of said second circuit arrangement.

* * * * *